(12) United States Patent
Deng

(10) Patent No.: US 8,462,542 B2
(45) Date of Patent: Jun. 11, 2013

(54) BIT-BY-BIT WRITE ASSIST FOR SOLID-STATE MEMORY

(75) Inventor: Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 195 days.

(21) Appl. No.: 12/822,706

(22) Filed: Jun. 24, 2010

(65) Prior Publication Data

US 2011/0317476 A1  Dec. 29, 2011

(51) Int. Cl.
*G11C 11/34* (2006.01)
(52) U.S. Cl.
USPC .......................................... 365/156; 365/205
(58) Field of Classification Search
USPC .................................. 365/156, 205
See application file for complete search history.

(56) References Cited

U.S. PATENT DOCUMENTS

| 7,376,038 | B2 | 5/2008 | Thiruvengadam et al. | |
|---|---|---|---|---|
| 7,385,841 | B2 | 6/2008 | Houston | |
| 7,453,743 | B2 | 11/2008 | Houston | |
| 7,589,991 | B2 * | 9/2009 | Masuo | 365/154 |
| 7,596,012 | B1 | 9/2009 | Su et al. | |
| 2008/0112212 | A1 * | 5/2008 | Wang et al. | 365/154 |
| 2009/0258471 | A1 | 10/2009 | Sadra et al. | |
| 2010/0046275 | A1 * | 2/2010 | Hosono et al. | 365/148 |
| 2010/0054015 | A1 * | 3/2010 | Lee et al. | 365/148 |
| 2010/0142261 | A1 * | 6/2010 | Kubo et al. | 365/163 |
| 2010/0309738 | A1 * | 12/2010 | Na | 365/201 |

OTHER PUBLICATIONS

Yamaoka et al., "Low-Power Embedded SRAM Modules with Expanded Margins for Writing", Paper No. 26.4, Tech. Digest of Int'l Solid-State Circuits Conference (IEEE, 2005), pp. 480-481, 611.
Zhang et al., "A 3-GHz 70-Mb SRAM in 65-nm CMOS Technology With Integrated Column-Based Dynamic Power Supply", J. Solid-State Circ., vol. 41, No. 1 (IEEE, Jan. 2006), pp. 146-151.
Deng, Xiaowei, "Memory Cell With Equalization Write Assist in Solid-State Memory", U.S. Appl. No. 12/834,914, filed Jul. 13, 2010.

\* cited by examiner

*Primary Examiner* — Michael Tran
(74) *Attorney, Agent, or Firm* — Rose Alyssa Keagy; Wade J. Brady, III; Fredrick J. Telecky, Jr.

(57) ABSTRACT

A solid-state memory in which write assist circuitry is implemented within each memory cell. Each memory cell includes a storage element, such as a pair of cross-coupled inverters, that is connected in series with a pair of power switch transistors between a power supply node and ground. One of the power switch transistors is gated by a word line indicating selection of the row containing the cell, and the other is gated by a column select signal indicating selection of the column containing the cell in a write cycle. Upon a write to the cell, both power switch transistors are turned off, removing bias from the inverter that assists its change of state in a write operation. In other embodiments, a single power switch transistor gated by either a word line or a column select signal may be used.

27 Claims, 13 Drawing Sheets

BIT-BY-BIT WRITE ASSIST FOR SOLID-STATE MEMORY

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention are more specifically directed to static random access memory (SRAM) cells and devices.

Many modern electronic devices and systems now include substantial computational capability for controlling and managing a wide range of functions and useful applications. The computational power of these modern devices and systems is typically provided by one or more processor "cores". These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues, especially in connection with embedded SRAM but also in SRAM realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written as expected.

These failure mechanisms include, among others, cell stability failures and write failures. In a general sense, a cell stability failure occurs when an SRAM cell that is not being written changes state, for example as a result of an access to that cell in a read cycle, or an access to a neighboring cell that disturbs the un-written cell sufficiently to cause its stored data state to "flip". A write failure occurs when an addressed SRAM cell does not change its stored state when written with the opposite data state, and a read failure occurs when an addressed cell fails to communicate a sufficiently strong signal indicative of its stored state.

These various failure mechanisms will now be described in further detail in connection with an example of a conventional SRAM cell, referring to FIG. 1. In this example, SRAM cell 12 of FIG. 1 is a conventional six-transistor (6-T) static memory cell 12, which in this case is in the $j^{th}$ row and $k^{th}$ column of a memory array. SRAM memory cell 12 is biased between the voltage on power supply line $V_{dda}$ and a ground reference voltage $V_{ssa}$. SRAM memory cell 12 is constructed in the conventional manner as a pair of cross-coupled CMOS inverters, one inverter of series-connected p-channel load transistor 13a and n-channel driver transistor 14a, and the other inverter of series-connected p-channel load transistor 13b and n-channel transistor 14b; the gates of the transistors in each inverter are connected together and to the common drain node of the transistors in the other inverter, in the usual manner. The common drain node of transistors 13a, 14a constitutes storage node SNT, and the common drain node of transistors 13b, 14b constitutes storage node SNB, in this example. N-channel pass transistor 15a has its source/drain path connected between storage node SNT and bit line $BLT_k$ for the $k^{th}$ column, and n-channel pass transistor 15b has its source/drain path connected between storage node SNB and bit line $BLB_k$. The gates of pass transistors 15a, 15b are driven by word line $WL_j$ for this $j^{th}$ row in which cell 12 resides.

In operation, bit lines $BLT_k$, $BLB_k$ are typically precharged to a high voltage (at or near power supply voltage $V_{dda}$), and are equalized to the same voltage. To access cell 12 for a read operation, word line $WL_j$ is then energized, turning on pass transistors 15a, 15b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 12 to latch in the desired state.

Cell stability refers to the ability of SRAM cell 12 to withstand static noise, without changing states. Typically, during operation, this static noise is present as voltage excursions at bit lines $BLT_k$, $BLB_k$, which can couple through pass transistors 15a, 15b to storage nodes SNT, SNB, respectively. Particularly in SRAM cells 12 that have weak or unbalanced transistors 13, 14, the coupling of a non-zero voltage to its storage node SNT, SNB holding a "0" level can cause cell 12 to flip its state. Cell stability is exacerbated for cells that are "half-selected" in a given cycle, such half-selected cells being those cells in an unselected column but in a selected row, or in an unselected row but in a selected column (e.g., to which a write is being performed).

Conversely, write failures in SRAM memories occur when the SRAM cell does not properly switch its stored state in a write operation. Typically, this failure has been observed to be due to the inability of write circuitry to pull down the storage node currently latched to a high voltage. For example, referring again to FIG. 1, beginning from a state in which storage node SNT is at a "1" and storage node SNB is at a "0", the writing of a "0" state will be performed by bit line $BLT_k$ being pulled low, and connected to storage node SNT by pass transistor 15a, while the precharged ($V_{dda}$) voltage is applied to storage node SNB via pass transistor 15b. The write of cell 12 thus depends on the ability of these bit line voltages to counteract the drive of transistors 13a and 14b. If device imbalances within cell 12 prevent the "flipping" of its state, the write operation will fail and storage node SNT will remain latched at a high level despite the attempted write. In this sense, therefore, write failures are the converse of cell stability failures—a write failure occurs if a cell is too stubborn in changing its state, while a cell stability failure occurs if a cell changes its state too easily.

In conventional SRAM cells such as 6-T SRAM cell 12 of FIG. 1, the designer is faced with a tradeoff between cell stability on one hand, and write margin on the other. In a general sense, cell stability is favored by pass transistors 15a, 15b having relatively weak drive as compared with load transistors 13 and driver transistors 14, because this results in weak coupling between the bit lines and storage nodes, and relatively strong drive of the latched state at storage nodes SNT, SNB. Conversely, write margin is favored by pass transistors 15a, 15b having relatively strong drive as compared with load transistors 13 and driver transistors 14, because this enables strong coupling between the bit lines and storage nodes, resulting in storage nodes SNT, SNB having weak resistance to changing state. Accordingly, the design of conventional 6-T SRAM cells 12 involves a tradeoff between these two vulnerabilities.

Unfortunately, the design window in which both adequate cell stability and adequate write margin can be attained is becoming smaller with continued scaling-down of device feature sizes, for the reasons mentioned above. In addition, it has been observed that the relative drive capability of p-channel MOS transistors relative to n-channel MOS transistors is increasing as device feature sizes continue to shrink, which skews the design window toward cell stability over write margin.

One conventional approach toward relaxing these ever-tightening design constraints is known in the art as "write-assist". According to this approach, the power supply bias applied to SRAM cells (e.g., power supply voltage $V_{dda}$ of FIG. 1) in write cycles is reduced, or disconnected so as to float. Conventional write-assist circuitry includes a power switch associated with each column of an array, if not multiple columns. For floating write assist bias, the power switch is controlled to disconnect the cells in the associated column from the power supply voltage. One approach to implementing reduced voltage write assist bias includes a power switch connected in parallel with a diode-connected transistor between the memory cells and the power supply voltage; this power switch is turned off in write cycles so that the cell bias is at least a diode voltage drop from the full power supply voltage. For either reduced or floating write assist bias, the drive of the load and driver transistors in the SRAM cell is reduced relative to the drive of the pass transistors, making it easier for the low level bit line to flip the state of the addressed cell.

As mentioned above, conventional write-assist circuitry is generally implemented on a per-column basis, in that the reduced or floating write bias is applied to one or more columns of memory cells, even though only one cell in a given column is selected for connection to the bit lines. Those cells that are "half-selected" in a write operation (i.e., are in a selected column receiving the reduced or floating write assist bias, but are not in the selected row) are vulnerable to undesired changes of state, due to the reduced cell bias. Given the large number of memory cells in a typical SRAM array, one or more retention "tail bits" with substantially weaker stability margin are often present within the array, especially in cutting-edge memories constructed with minimum feature size geometries, as mentioned above. These marginal retention tail bits require a higher cell bias in order to retain a data state during a write to a cell in the same column. As such, to avoid data retention failure, the write assist voltage must be kept above the retention voltage of the weakest, or most unstable, bits in the SRAM array. This reduces the ability of write assist techniques to widen the ever-shrinking design window.

BRIEF SUMMARY OF THE INVENTION

Embodiments of this invention provide a memory array, and method of operating the same, in which strong write assist is applied without impacting the stability of half-selected cells.

Embodiments of this invention provide such an array and method in which design constraints on the memory cells can be skewed to favor cell stability.

Embodiments of this invention provide such an array and method in which write operations can be carried out faster than in conventional memories.

Embodiments of this invention provide such an array and method that are compatible with modern sub-micron transistor sizes in which the drive of p-channel load transistors in the memory cells approaches that of n-channel driver transistors.

Other objects and advantages of this invention will be apparent to those of ordinary skill in the art having reference to the following specification together with its drawings.

The present invention may be implemented into a memory cell, such as a static random access memory (SRAM) cell, by way of one or more power switch transistors included within the cell, and connected in series with the storage element of the cell between first and second bias voltage nodes. The power switch transistors are controlled by signals involved in the address and selection of the particular memory cell. The select signal may be the word line for the row containing the cell, or a column select line for the column containing the cell. In one embodiment, two parallel power switch transistors are provided between the bias voltage and the storage element, with one switch transistor controlled by the word line and the other controlled by the column select signal. The power switch transistors may be header devices (i.e., between the storage element and the $V_{dd}$ power supply voltage) or footer devices (i.e., between the storage element and ground).

DETAILED DESCRIPTION OF THE INVENTION

The present invention will be described in connection with its preferred embodiment, namely as implemented into a static random access memory (SRAM) embedded within a larger scale integrated circuit, and constructed according to complementary metal-oxide-semiconductor (CMOS) technology, because it is contemplated that this invention is especially beneficial in such an application. However, it is contemplated that those skilled in the art having reference to this specification will readily recognize that this invention may be applied to a wide range of memory devices, including other types of static memory such as ferroelectric random access memories (FRAMs, or FeRAMs), dynamic random access memories (DRAMs), and the like. Accordingly, it is to be understood that the following description is provided by way of example only, and is not intended to limit the true scope of this invention as claimed.

Figure 1:
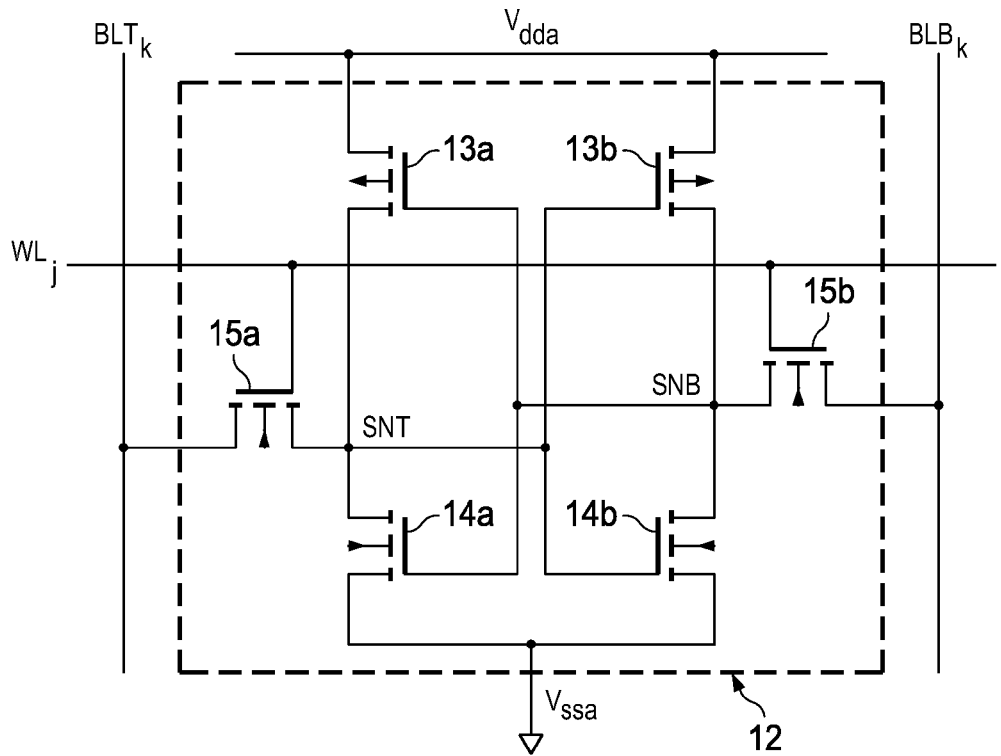
FIG. 1 is an electrical diagram, in schematic form, of a conventional SRAM memory cell.
Figure 2:
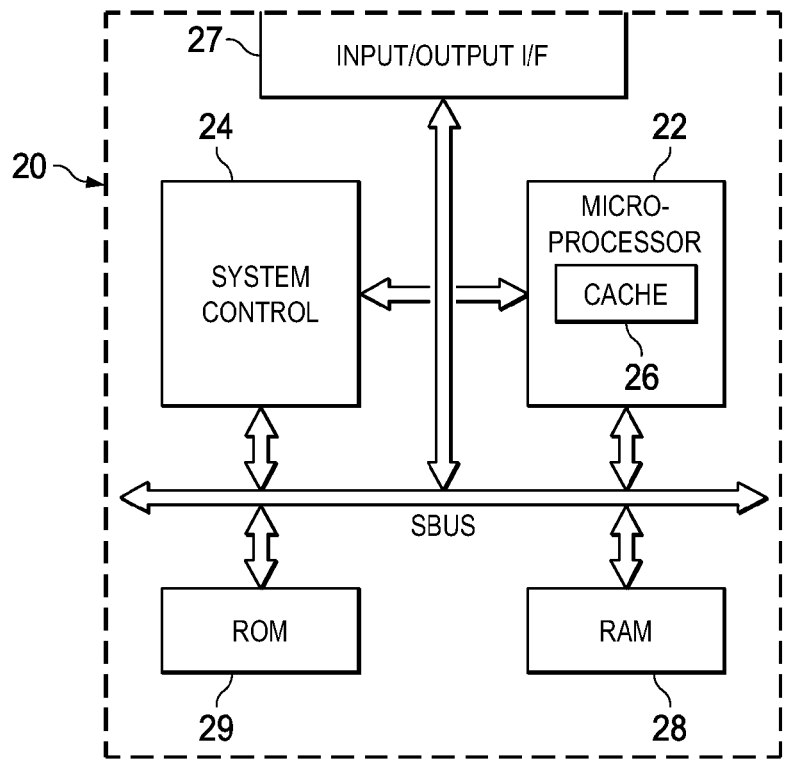
FIG. 2 is an electrical diagram, in block form, of a large scale integrated circuit constructed according to embodiments of the invention.

FIG. 2 illustrates an example of large-scale integrated circuit 20, in the form of a so-called "system-on-a-chip" ("SoC"), as now popular in many electronic systems. Integrated circuit 20 is a single-chip integrated circuit into which an entire computer architecture is realized. As such, in this example, integrated circuit 20 includes a central processing unit of microprocessor 22, which is connected to system bus SBUS. Various memory resources, including random access memory (RAM) 28 and read-only memory (ROM) 29, reside on system bus SBUS and are thus accessible to microprocessor 22. Typically, ROM 29 serves as program memory, storing the program instructions executable by microprocessor 22, while RAM 28 serves as data memory; in some cases, program instructions may reside in RAM 28 for recall and execution by microprocessor 22. Cache memory 26 (such as level 1, level 2, and level 3 caches, each typically implemented as SRAM) provides another memory resource, and resides within microprocessor 22 itself and therefore does not require bus access. Other system functions are shown, in a generic sense, in integrated circuit 20 by way of system control 24 and input/output interface 27.

Those skilled in the art having reference to this specification will recognize that integrated circuit 20 may include additional or alternative functions to those shown in FIG. 2, or may have its functions arranged according to a different architecture from that shown in FIG. 2. The architecture and functionality of integrated circuit 20 is thus provided only by way of example, and is not intended to limit the scope of this invention.

Figure 3:
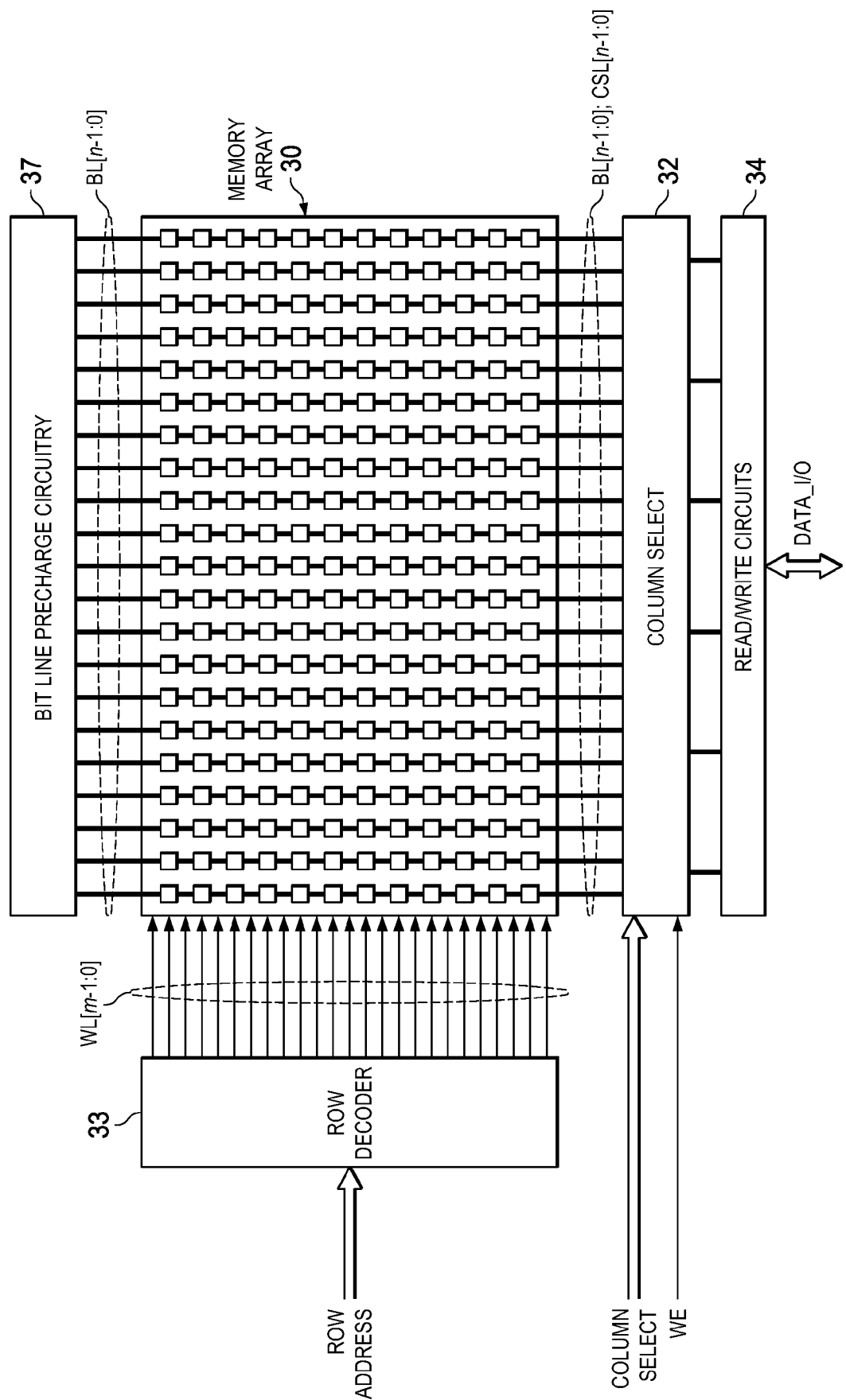
FIG. 3 is an electrical diagram, in block form, of a memory in the integrated circuit of FIG. 2, constructed according to embodiments of the invention.

The construction of RAM 28 in integrated circuit 20 will now be described in further detail, with reference to FIG. 3. Of course, a similar construction may be used to realize other memory resources such as cache memory 26; further in the alternative, RAM 28 may correspond to a stand-alone memory integrated circuit (i.e., not an embedded memory as shown in FIG. 2). Those skilled in the art having reference to this specification will comprehend that the memory architecture of RAM 28 in FIG. 3 is provided by way of example only.

In this example, RAM 28 includes many memory cells arranged in rows and columns within memory array 30. The construction of these memory cells according to embodiments of this invention will be described in further detail below. In this example, memory array 30 includes m rows and n columns of SRAM cells, with cells in the same column sharing a pair of bit lines BL[n−1:0], and with memory cells in the same row sharing one of word lines WL[m−1:0]. Bit line precharge circuitry 37 is provided to apply a desired precharge voltage to the pairs of bit lines BL[n−1:0] in advance of read and write operations. Row decoder 33 receives a row address value indicating the row of memory array block 30 to be accessed, and energizes the one of word lines WL[m−1:0] corresponding to that row address value. Column select circuit 32 receives a column address value, and in response selects pairs of bit lines BL[n−1:0] associated with one or more columns to be placed in communication with read/write circuits 34. In some embodiments of this invention, column select circuit 32 forwards column select lines CSL[n−1:0] to the memory cells in each of the n columns of memory array 30. Read/write circuits 34, which may be realized as conventional sense amplifiers and write circuits as known in the art for SRAM devices, are in communication with bus DATA I/O, by way of which output data and input data are communicated from and to the addressed memory cells within memory array 30, in the conventional manner.

Of course, many variations in the particular memory arrangement can be realized within this architecture, and by way of variations to this architecture, in connection with this embodiment of the invention. For example, read/write circuits may be placed between bit lines BL[n−1:0] and column select circuits, such that each bit line pair is connected to a read/write circuit, with the column select circuits selecting which read/write circuits are to be placed in communication with data bus DATA I/O.

The construction of memory cells arranged in memory array 30, according to embodiments of this invention, will now be described. This construction will be described using, by way of example, SRAM cells formed of cross-coupled CMOS inverters, because it is contemplated that this invention is especially beneficial when used in connection with such memory cells. However, it is also contemplated that embodiments of this invention will provide important benefits in memories of other types, such as SRAM cells with resistor loads, ferroelectric static RAM (FeRAM) cells that are based on cross-coupled inverters, and the like. It is contemplated that those skilled in the art having reference to this specification will be readily able to apply embodiments of this invention to advantage in connection with such other memory cell types and technologies.

Figure 4:
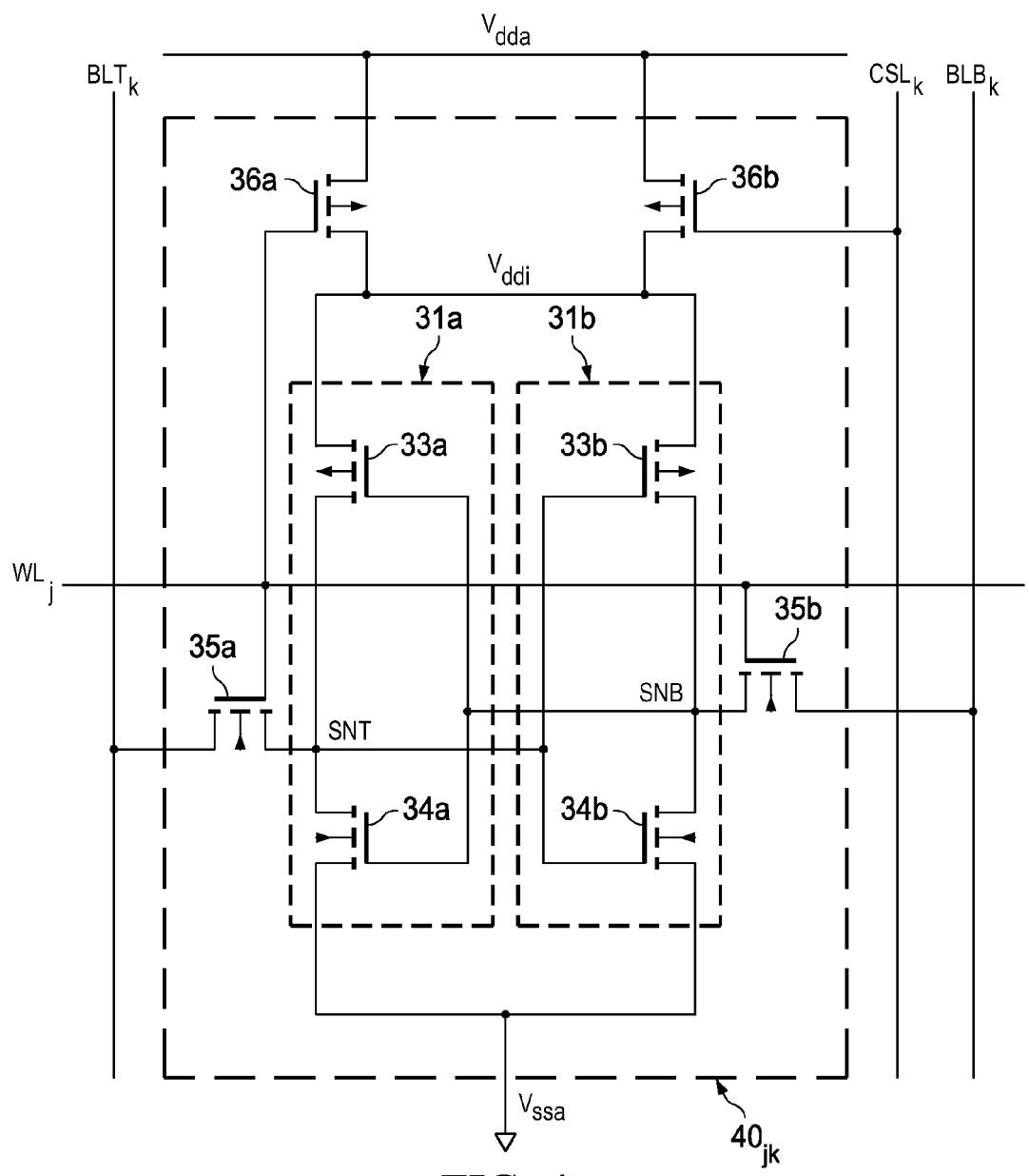
FIG. 4 is an electrical diagram, in schematic form, of a memory cell in the memory of FIG. 3 according to an embodiment of the invention.

FIG. 4 illustrates the construction of SRAM cell $40_{jk}$ according to a first embodiment of the invention. In this construction, SRAM cell $40_{jk}$ includes a storage element formed by a pair of cross-coupled CMOS inverters $31a$, $31b$. As shown in FIG. 4, inverter $31a$ is formed by p-channel MOS load transistor $33a$ and n-channel MOS driver transistor $34a$, which have their drains connected together at storage node SNT and their gates connected together at storage node SNB. The source of load transistor $33a$ is connected to bias node $V_{ddi}$, and the source of driver transistor $34a$ is connected to ground, or reference, node $V_{ssa}$. Inverter $31b$ in SRAM cell $40_{jk}$ is similarly constructed as p-channel MOS load transistor $33b$ and n-channel MOS driver transistor $34b$. The drains of transistors $33b$, $34b$ are connected together at storage node SNB, and their gates are connected together at storage node SNT, thus cross-coupling storage nodes SNT, SNB. The source of transistor $33b$ is at bias node $V_{ddi}$ and the source of transistors $34b$ is at ground node $V_{ssa}$.

When deployed in a memory architecture such as that described above relative to FIG. 3, SRAM cell $40_{jk}$ corresponds to the memory cell in row j and column k of that memory array 30. As such, SRAM cell $40_{jk}$ includes n-channel MOS pass transistor $35a$ with its source/drain path connected between storage node SNT and bit line $BLT_k$ (for column k in memory array 30); similarly, n-channel MOS pass transistor $35b$ has its source/drain path connected between storage node SNB and bit line $BLB_k$. The gates of pass transistors $35a$, $35b$ are connected to word line $WL_j$, which is driven by row decoder 33 responsive to the received row address indicating selection of row j. In the architecture of FIG. 3, for example, bit lines $BLT_k$, $BLB_k$ are coupled to bit line precharge circuitry 37, one on end, and to column select circuitry 32, on the other. Each of memory cells 40 in column k of memory array 30 are, of course, also coupled to bit lines $BLT_k$, $BLB_k$. Similarly, each of memory cells 40 in row j of memory array 30 are coupled to word line $WL_j$.

According to this embodiment of the invention, power switch transistors $36a$, $36b$ are also included within memory cell $40_{jk}$. Power switch transistors $36a$, $36b$ are each p-channel MOS transistors in this example, with their source/drain paths connected in parallel with one another, and in series with the cross-coupled inverters of transistors 33, 34 between power supply voltage node $V_{dda}$ and ground voltage node— $V_{ssa}$—. More specifically, in the example of FIG. 4, the drains of power switch transistors $36a$, $36b$ are connected to bias node $V_{ddi}$, and their sources are connected to power supply voltage node $V_{dda}$. Transistor $36a$ receives word line $WL_j$ at its gate, and transistor $36b$ receives column select line $CSL_k$ for column k at its gate. Accordingly, when word line $WL_j$ and column select line $CSL_k$ are asserted active high, respective p-channel transistors $36a$, $36b$ are turned off, resulting in the opening of switches between power supply voltage node $V_{dda}$ and ground voltage node— $V_{ssa}$—. Referring back to FIG. 3, column select circuitry 32 asserts column select line $CSL_k$ to an active (high) level in response to receiving a column address value corresponding to the selection of column k. For optimal read cycle operation, column select lines CSL[n−1:0] may be asserted by column select circuitry 32 only in write cycles, responsive to an active level on write enable line WE (FIG. 3); alternatively, column select lines CSL[n−1:0] may be asserted in both read and write cycles.

Figure 5:
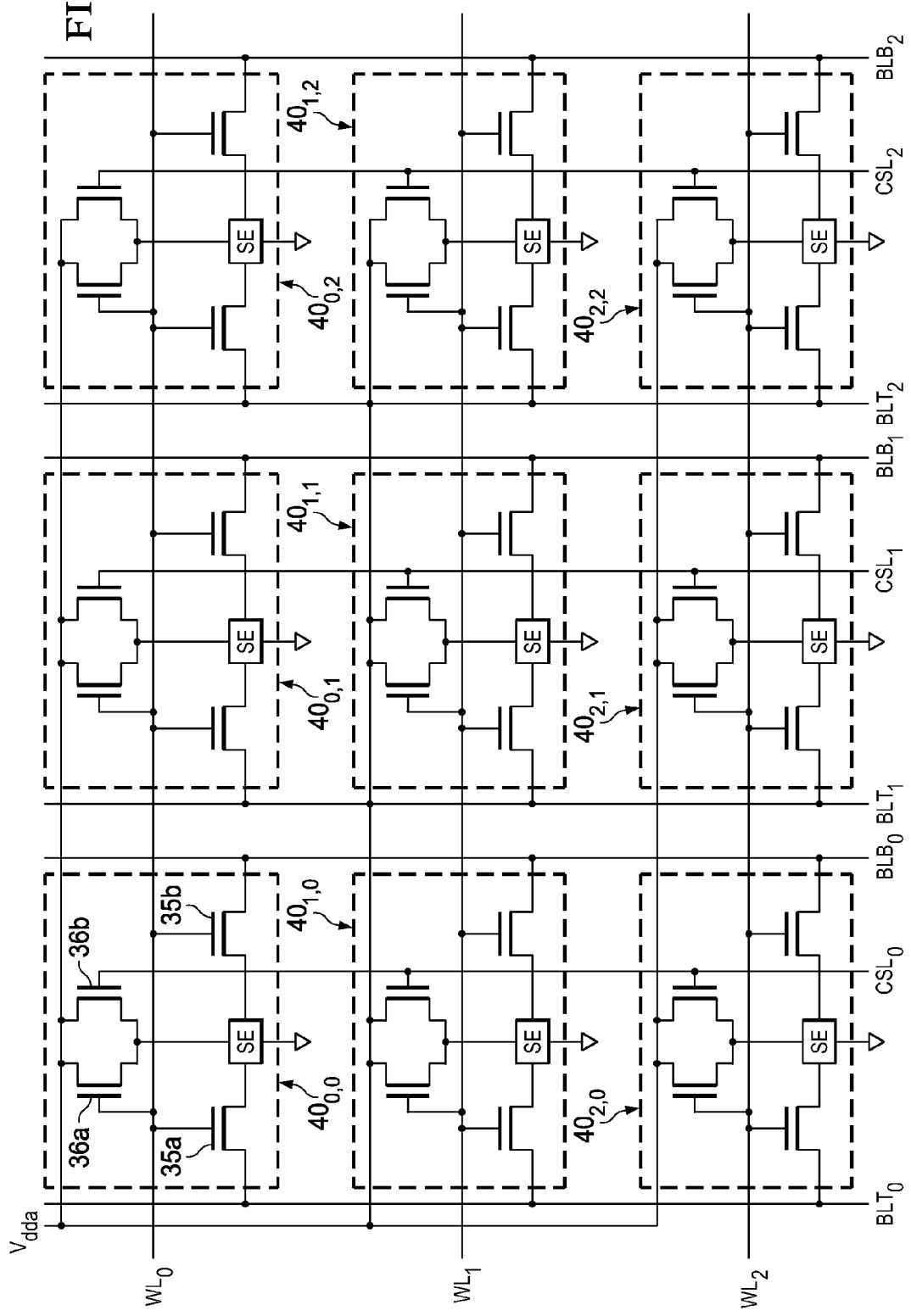
FIG. 5 is an electrical diagram, in schematic form, of a memory array including the memory cell of FIG. 4 according to an embodiment of the invention.

The arrangement of multiple memory cells 40 into memory array 30 is illustrated in FIG. 5, with reference to a 3×3 portion of memory array 30. The portion of memory array 30 shown in FIG. 5 includes portions of rows j=0 through 2, and portions of columns k=0 through 2. Memory cells $40_{0,x}$ (i.e., cells $40_{0,0}$, $40_{0,1}$, $40_{0,2}$) receive word line $WL_0$, memory cells $40_{1,x}$ receive word line $WL_1$, and memory cells $40_{2,x}$ receive word line $WL_2$. Similarly, memory cells $40_{x,0}$ (i.e., cells $40_{0,0}$, $40_{1,0}$, $40_{2,0}$) receive column select line $CSL_0$, memory cells $40_{x,1}$ receive column select line $CSL_1$, and memory cells $40_{x,2}$ receive column select line $CSL_2$. According to this embodiment of the invention described above in connection with FIG. 4, each of cells 40 in memory array 30 includes storage element SE (e.g., cross-coupled inverters $31a$, $31b$), pass transistors $35a$, $35b$ and power switch transistors $36a$, $36b$, as shown by the example of memory cell $40_{0,0}$. And each of cells 40 in memory array 30 is biased between power supply node $V_{dda}$ and ground node $V_{ssa}$, with its storage element SE connected in series with its own pair of power switch transistors $36a$, $36b$ between those nodes $V_{dda}$, $V_{ssa}$.

Referring back to FIG. 4, the operation of memory cell $40_{jk}$ according to this embodiment of the invention depends on whether memory cell $40_{jk}$ is selected by the address values applied to row decoder 33 and column select circuitry 32. In cycles in which row j is not selected (word line $WL_j$ is inactive at a low logic level), pass transistors $35a$, $35b$ are held off, and power switch transistor $36a$ is turned on. The power supply voltage at node $V_{dda}$ is thus applied to bias node $V_{ddi}$ (regardless of the state of transistor $36b$), and transistors 33, 34 thus actively maintain the previously stored state at storage nodes SNT, SNB. In cycles in which column k is not selected (column select line $CSL_k$ is inactive at a low logic level), power switch transistor $36b$ is turned on, applying the power supply voltage at node $V_{dda}$ to bias node $V_{ddi}$. As such, according to this construction, if memory cell $40_{jk}$ is in a half-selected state (column k is selected but row j is not selected, or row j is selected but column k is not selected), the power supply voltage at node $V_{dda}$ remains applied to the sources of transistors $33a$, $33b$ via one of power switch transistors $36a$, $36b$. Of course, both of power switch transistors $36a$, $36b$ remain on in cycles in which neither of row j and column k is selected, and also during standby or data retention mode. As a result of this embodiment of the invention, the data retention of memory cell $40_{jk}$ is not affected even if half-selected, in contrast to memories including conventional column-based write assist circuits.

Figure 6:
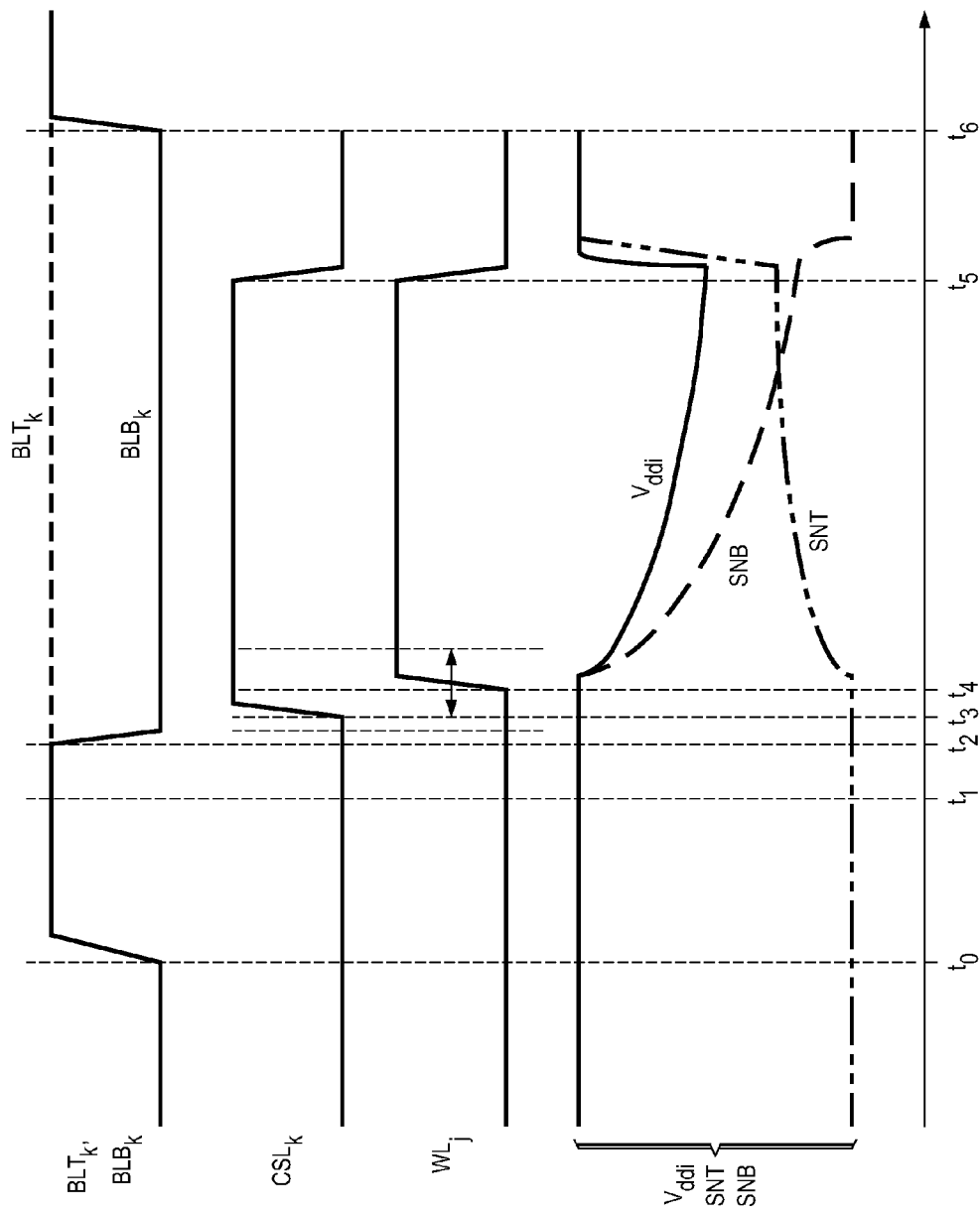
FIG. 6 is a timing diagram illustrating the operation of the memory cell of FIG. 4 according to an embodiment of the invention.

In a write operation to memory cell $40_{jk}$, both of word line $WL_j$ and column select line $CSL_k$ are energized. FIG. 6 illustrates the timing of such a write cycle to selected memory cell $40_{jk}$, according to this embodiment of the invention, with reference also to FIGS. 3 and 4. Prior to the beginning of the write cycle at time $t_0$, all word lines including word line $WL_j$ are inactive (at a low logic level, in this example); in addition, all column select lines including column select line $CSL_k$ are also inactive low. As such, referring to FIG. 4, power switch transistors $36a$, $36b$ are both turned on, coupling the voltage at power supply voltage node $V_{dda}$ to bias node $V_{ddi}$, and thus to the storage element of the cross-coupled inverters $31a$, $31b$. In the example shown in FIG. 6, storage node SNB is at a high "1" level prior to time $t_0$, and storage node SNT is at a low "0" level, as established by load transistor $33b$ and driver transistor $34a$ both being turned on. Prior to time $t_0$, this state is maintained by power switch transistors $36a$, $36b$ both turned on, and applying the full bias of power supply voltage $V_{dda}$ at bias node $V_{ddi}$.

The write cycle begins, at time $t_0$, with bit line precharge circuitry 37 precharging bit lines $BLT_k$, $BLB_k$ (as well as all bit line pairs in memory array 30) to a high voltage, for example to power supply voltage $V_{dda}$. At time $t_1$, precharge circuitry 31 turns off; the precharged high voltage remains at then-floating bit lines $BLT_k$, $BLB_k$. The write operation begins at time $t_2$, with the write circuit for column k (within read/write circuits 34) driving bit line $BLB_k$ to a low level, to change the state of cell $40_{jk}$ from its current "0" state to a "1" state (i.e., storage node SNT will be written to a "1" level), in this example. At time $t_3$, column select line $CSL_k$ is driven active high by column select circuitry 32. At time $t_4$, word line $WL_j$ is then driven active high, which turns on pass transistors 35a, 35b (FIG. 4) and thus couples storage nodes SNT, SNB to bit lines $BLT_k$, $BLB_k$, respectively. With both of word line $WL_j$ and column select line $CSL_k$ driven high beginning from time $t_4$, p-channel MOS power switch transistors 36a, 36b are both turned off, which isolates bias node $V_{ddi}$ from power supply node $V_{dda}$. Active bias is thus removed from the cross-coupled inverters 31a, 31b, beginning at time $t_4$ (i.e., at the later of word line $WL_j$ and column select line $CSL_k$ driven high); of course, due to parasitic capacitances of transistors and conductors within cell $40_{jk}$, energy will remain at bias node $V_{ddi}$, even though it is no longer actively driven from power supply node $V_{dda}$.

The particular timing of column select line $CSL_k$ and word line $WL_j$ relative to one another can vary, as suggested by FIG. 6. The transition at word line $WL_j$ can lead or lag the transition at column select line $CSL_k$, or the two can be nominally simultaneous. The particular timing of these signals can be selected as convenient for the design and operation of RAM 28. Furthermore, in the alternative to the example of FIG. 6, the transitions at column select line $CSL_k$ and word line $WL_j$ can lead or be nominally simultaneous with the driving of one of bit lines $BLT_k$, $BLB_k$.

The actual write of cell $40_{jk}$ begins at time $t_4$, as pass transistor 35b is turned on by word line $WL_j$ and thus couples the low level at bit line $BLB_k$ to storage node SNB. Accordingly, beginning from time $t_4$, bit line $BLB_k$ discharges storage node SNB from its prior "1" state; conversely, because pass transistor 35a is also turned on by word line $WL_j$, the precharged high level at bit line $BLT_k$ begins to raise the voltage at storage node SNT of cell $40_{jk}$. The write is assisted by power switch transistors 36a, 36b both being off within cell $40_{jk}$ at this time, because the drive of transistor 33b (previously turned on by the low level at storage node SNT) is weakened by the floating state of bias node $V_{ddi}$. Storage node SNB of selected cell $40_{jk}$ is thus more easily pulled low by bit line $BLB_k$, as evident by the discharging of bias node $V_{ddi}$ shown in FIG. 6 following time $t_3$. The latching of the new data state into cell $40_{jk}$ begins at time $t_5$, with word line $WL_j$ and column select line $CSL_k$ both driven back to a low logic level. Upon the first one of word line $WL_j$ and column select line $CSL_k$ driven low, bias node $V_{ddi}$ is again coupled to power supply node $V_{dda}$, supplying active bias to load transistors 33a, 33b; bias node $V_{ddi}$ is rapidly charged back up to power supply voltage $V_{dda}$ following time $t_5$, as shown in FIG. 6. In addition, pass transistors 35a, 35b are turned off at time $t_4$, removing the load of bit lines $BLT_k$, $BLB_k$ from storage nodes SNB, SNT. Because storage node SNB has discharged toward the low voltage at bit line $BLB_k$ at time $t_5$, the transition of word line $WL_j$ and column select line $CSL_k$ causes the new data state to latch. This latching is evident in FIG. 6 by storage node SNB being rapidly pulled low by driver transistor 34b, and storage node SNT being rapidly driven high by load transistor 33a, both of which are now turned on by the change in state at storage nodes SNT, SNB. The write cycle is then complete, prior to time $t_6$ at which bit lines $BLT_k$, $BLB_k$ are precharged at the beginning of the next cycle.

Referring back to the portion of memory array 30 shown in FIG. 5, the implementation of power switch transistors 36a, 36b in each cell 40 provides write assist on a cell-by-cell basis. For example, if row "1" is selected (word line $WL_1$ driven high) and column "2" is selected (column select line $CSL_2$ driven high) in a given write cycle, only memory cell $40_{1,2}$ will have its bias node $V_{ddi}$ isolated from power supply node $V_{dda}$ in that cycle. Power switch transistors 36b will remain on in half-selected cells $40_{1,0}$, $40_{1,2}$ in selected row "1", and power switch transistors 36a will remain on in half-selected cells $40_{0,2}$, $40_{2,2}$ in selected column "1". According to this embodiment of the invention, therefore, data retention will not be adversely affected in the half-selected cells 40, even with floating bias write assist applied to the selected cells 40.

This description has referred to the situation in which column select lines $CSL_k$ are driven high only in write cycles, for example by column select circuitry 32 receiving write enable signal WE as shown in FIG. 3. In this example, with column select line $CSL_k$ remaining at a low level in read cycles involving selected column k, it is contemplated that no deleterious effect is present either from the standpoint of read current or data retention. Alternatively, however, it is also contemplated that column select line $CSL_k$ may be energized for selected column k even in a read cycle (e.g., to simplify the periphery circuits). In this alternative case, both of power switch transistors 36a, 36b will be turned off in those cells $40_{jk}$ residing in both the selected row j and the selected column k. However, it is contemplated that a successful read can be performed even with bias node $V_{ddi}$ floating in many designs incorporating this embodiment of the invention, without causing an undesired change of state as a result of the read; this has been borne out by simulation. On the other hand, additional margin will likely be provided by asserting column select line $CSL_k$ during write cycles and not during read cycles, in the manner described above.

Figure 7:
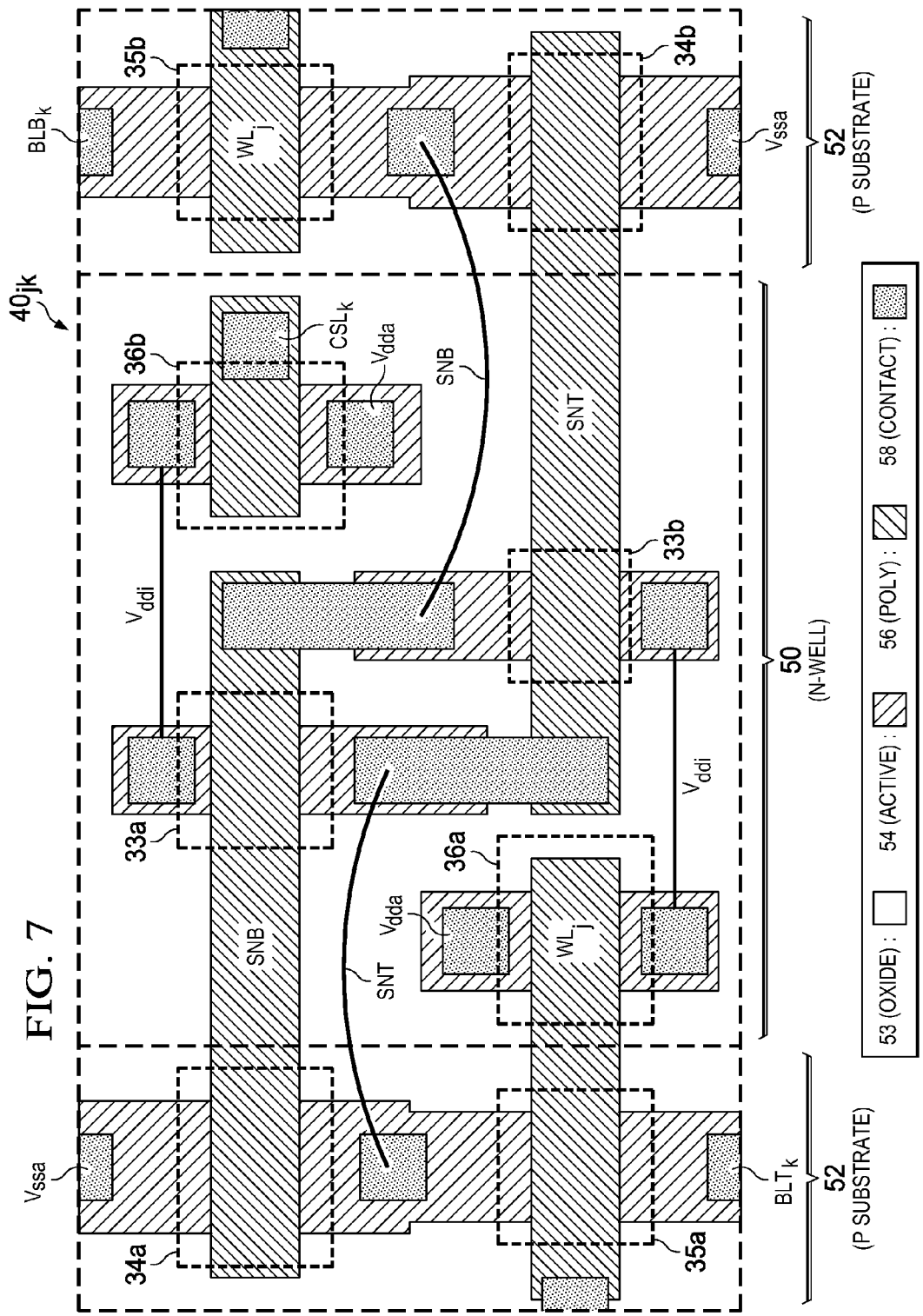
FIG. 7 is a plan view of the surface of an integrated circuit illustrating an example of the layout of the memory cell of FIG. 4 according to an embodiment of the invention.

Memory cell $40_{jk}$ constructed according to this embodiment of the invention can be realized efficiently from the standpoint of chip area, as will now be described in connection with FIG. 7. FIG. 7 illustrates, in plan view, an example of the layout of memory cell $40_{jk}$ at the surface of a silicon substrate, fabricated according to conventional CMOS technology. This plan view of FIG. 7 illustrates cell $40_{jk}$ prior to the formation of overlying metal layers, and as such illustrates diffused active regions, polysilicon gate elements, and contact openings (both metal-to-active contacts, and also metal-to-poly contacts).

As shown in FIG. 7, cell $40_{jk}$ is formed into a region of p-type substrate 52, at which n-well 50 has been formed by conventional methods. N-channel MOS transistors 34a, 35a are formed into one region of p-type substrate 52, and n-channel MOS transistors 34b, 35b are formed into another region of p-type substrate 52. P-channel MOS transistors 33a, 33b, 36a, 36b are formed into n-well 50, which in this example lies between the two regions of p-type substrate 52 in cell $40_{jk}$; adjacent cells 40 can be formed on all four sides of cell $40_{jk}$, such that n-well 50 and regions of substrate 52 can be shared from cell to cell. In the conventional manner, active regions 54 are defined at the surface, between isolation oxide structures 53 formed as LOCOS field oxide or as shallow trench isolation (STI) structures, also in the conventional manner. Polysilicon elements 56 are patterned to extend above the surface, separated from the surface by gate oxide (not visible in this plan view) or by isolation oxide 53, as the case may be. Of course, active regions 54 within n-well 50 that are not underlying poly elements 56 will be p-type, and active regions 54 within regions of p-type substrate 52 that are not underlying poly elements 56 will be n-type. Contact openings 58 extend to active regions 54 or to poly elements 56, at the locations shown in FIG. 7 for this layout. Metal conductors (not shown in FIG. 7) will overly the structure, making contact via respective contact openings 58.

FIG. 7 illustrates the outline of the various transistors 33, 34, 35, 36 within cell $40_{jk}$, corresponding to the electrical schematic of FIG. 4. In this FIG. 7, as is fundamental in the art, MOS transistors are located at regions of the surface at which a gate element (i.e., poly element 56 in this example) overlies an instance of active region 54. FIG. 7 schematically illustrates internal metal connections between certain contact openings 58, for example indicating the extending of storage node SNT from active region 54 between transistors 34a, 35a to contact opening 58 at transistor 33a, and to poly element 56 serving as the gate of transistors 33b, 34b. Conversely, a metal connection will extend storage node SNB from active region 54 between transistors 34b, 35b to contact opening 58 at transistor 33b, and to poly element 56 serving as the gate of transistors 33a, 34a. Internal metal connections are also schematically illustrated as forming bias node $V_{ddi}$ by interconnecting active regions 54 between transistors 33b, 36a, and between transistors 33a and 36b, within p-well 52.

As evident from FIG. 7, power switch transistors 36a, 36b can be efficiently realized from the standpoint of chip area. In this simplified example, the additional chip area required for these devices amounts to additional width of n-well 52, along the horizontal dimension in the orientation of FIG. 7. Of course, the layout of FIG. 7 is presented by way of example only, it being understood that the particular layout of cell $40_{jk}$ can widely vary from that shown, depending on the particular manufacturing technology and design rules applicable to each implementation, and on the layout optimization arrived at by those skilled in that art.

Numerous variations to the arrangement of cell $40_{jk}$, according to embodiments of this invention, will be apparent to those skilled in the art having reference to this specification. Several of those variations will now be described with reference to FIGS. 8a through 8c, in which like elements with cell $40_{jk}$ of FIG. 4 will be referred to by the same reference numerals.

Figure 8A:
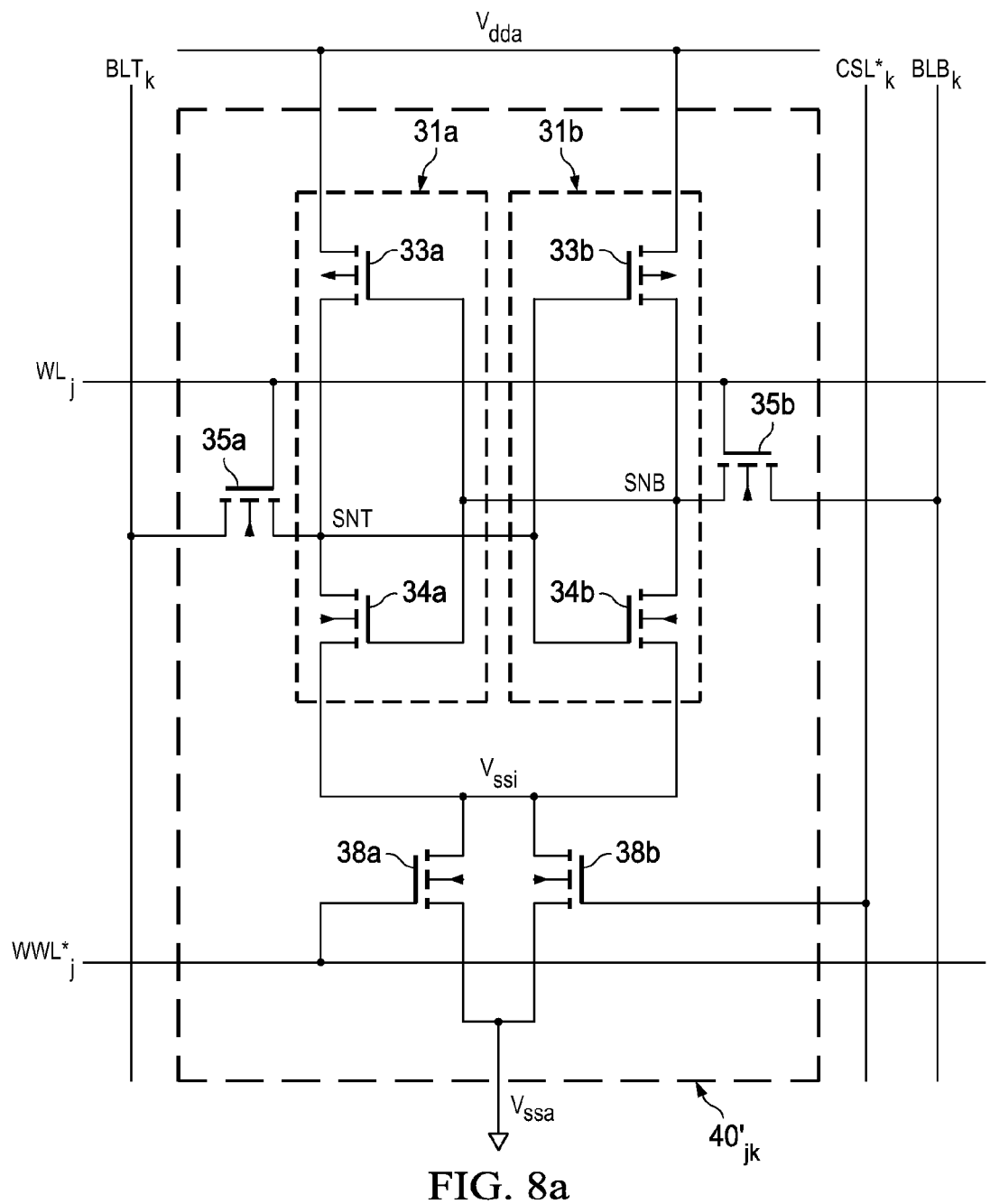
FIGS. 8a through 8c are electrical diagrams, in schematic form, of a memory cell in the memory of FIG. 3 according to alternative embodiments of the invention.

FIG. 8a illustrates memory cell $40'_{jk}$, in which power switch transistors 38a, 38b are implemented as "footer" devices. Memory cell $40'_{jk}$ is constructed similarly to cell $40_{jk}$ described above, in that it includes a pair of cross-coupled inverters 31a, 31b (i.e., transistors 33a, 34a; transistors 33b, 34b) establishing storage nodes SNT, SNB that are coupled to complementary bit lines $BLT_k$, $BLB_k$ by n-channel MOS pass transistors 35a, 35b, respectively. In this case, however, p-channel load transistors 33a, 33b have their sources connected directly to power supply node $V_{dda}$. The sources of n-channel driver transistors 34a, 34b are connected to one another at bias node $V_{ssi}$. Power switch transistor 38a is an n-channel MOS transistor with its drain at bias node $V_{ssi}$ and its source at ground node $V_{ssa}$; similarly, power switch transistor 38b in cell $40'_{jk}$ is an n-channel MOS transistor with its source/drain path connected in parallel with that of transistor 38a, between bias node $V_{ssi}$ and its source at ground node $V_{ssa}$. In this embodiment of the invention, the gate of power switch transistor 38a receives write word line $WWL^*_j$, and the gate of power switch transistor 38b receives column select signal $CSL^*_k$; the "*" indication designates that write word line $WWL^*_j$ and column select signal $CSL^*_k$ are active at a low logic level. In this case, write word line $WWL^*_j$ is active low during write cycles in which row j is selected, but remains inactive high during read cycles in which row j is selected and during read and write cycles in which row j is not selected. Column select line $CSL^*_k$ is active low in write cycles in which column k is selected, and inactive high in cycles in which column k is not selected; column select line $CSL^*_k$ may also be held inactive high in read cycles in which column k is selected, if desired.

The operation of cell $40'_{jk}$ is similar to that of cell $40_{jk}$ described above. It is contemplated that bit lines $BLT_k$, $BLB_k$ are precharged to high voltages at the beginning of each cycle, as before. In read and write cycles in which either row j or column k is not selected, either or both of power switch transistors 38a, 38b will remain turned on by an inactive high level at either or both of write word line $WWL^*_j$ and column select line $CSL^*_k$. One or both of power switch transistors 38a, 38b remain on, accordingly, such that ground node $V_{ssa}$ is coupled to the sources of driver transistors 34a, 34b, maintaining full bias to cross-coupled inverters 31a, 31b of cell $40'_{jk}$. In this embodiment of the invention, in a read cycle in which row j is selected (i.e., word line $WL_j$ is driven active high), write word line $WWL^*_j$ is also held inactive high, such that power switch transistor 38a remains on, coupling ground node $V_{ssa}$ to the sources of driver transistors 34a, 34b and maintaining full bias in cell $40'_{jk}$, regardless of the state of column select line $CSL^*_k$.

In a write cycle in which row j and column k associated with cell $40'_{jk}$ are selected, both of write word line $WWL^*_j$ and column select line $CSL^*_k$ are driven to low logic levels, turning off both of power switch transistors 38a, 38b. This of course isolates bias node $V_{ssi}$ from ground node $V_{ssa}$, floating the source nodes of transistors 34a, 34b. Referring to the timing diagram of FIG. 6, in many cases it may be preferable to slightly delay the energizing of word line $WL_j$ (i.e., delay the turning on of pass transistors 35a, 35b) from this transition of write word line $WWL^*_j$ and column select line $CSL^*_k$, to float the sources of transistors 34a, 34b before the low level one of bit lines $BLT_k$, $BLB_k$ is coupled to the corresponding storage node, to facilitate the flipping of the cell state in the write operation. This delay is not essential, however, and as such the relative timing among word line $WL_j$, write word line $WWL^*_j$, and column select line $CSL^*_k$ can vary, as mentioned above. In any event, the decoupling of ground node $V_{ssa}$ from bias node $V_{ssi}$, and thus from the source nodes of driver transistors 34a, 34b, reduces the drive of cross-coupled inverters 31a, 31b, and thus facilitates the change of state stored by cell $40'_{jk}$ desired by this write cycle.

Figure 8B:
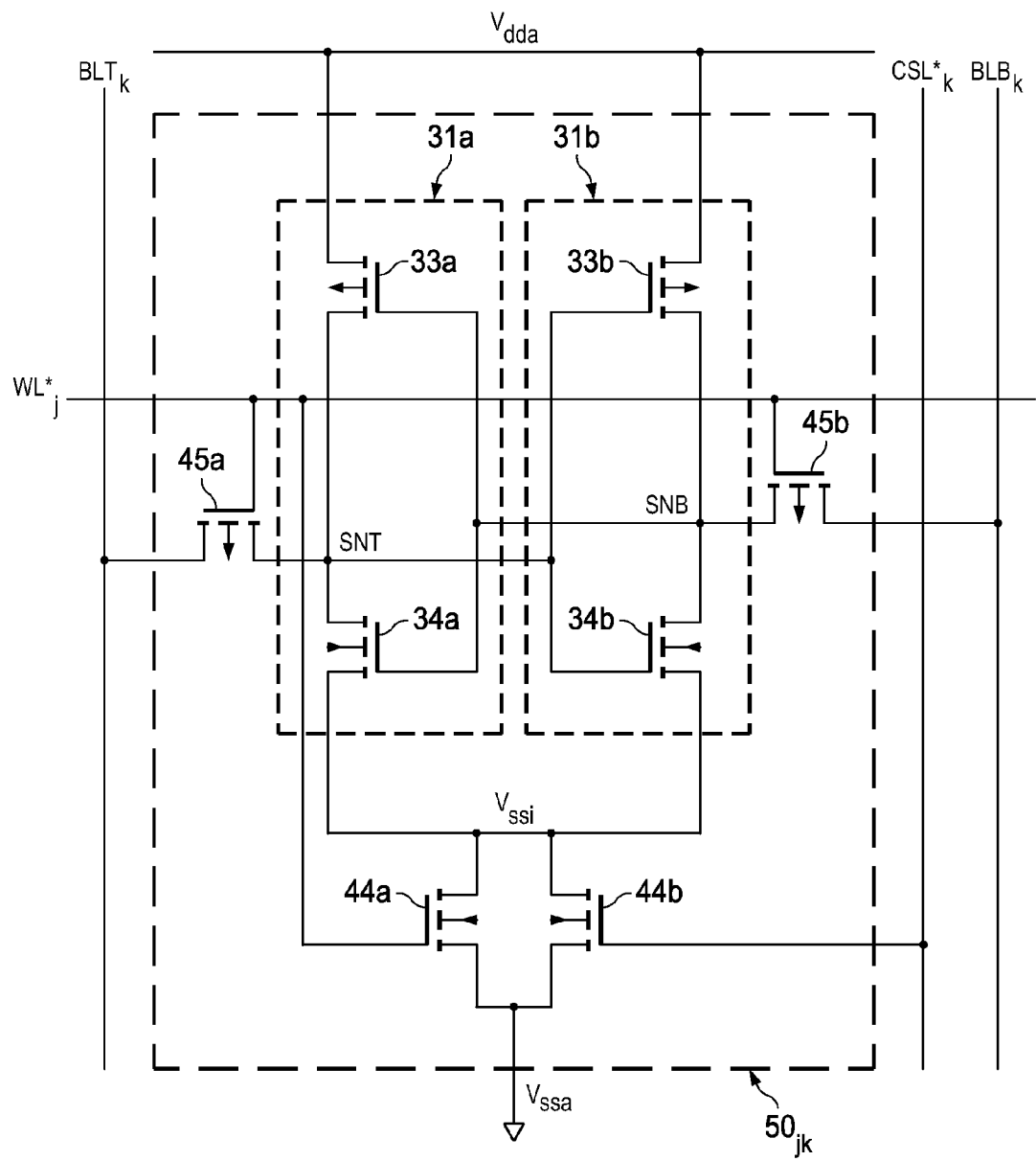

FIG. 8b illustrates memory cell $50_{jk}$ according to another alternative arrangement, more specifically in connection with a complementary construction to memory cell $40_{jk}$ of FIG. 4. In memory cell $50_{jk}$, n-channel transistors 34a, 34b serve as load transistors in the cross-coupled inverters 31a, 31b, and p-channel transistors 33a, 33b serve as the driver transistors. P-channel MOS pass transistor 45a has its source/drain path connected between storage node SNT and bit line $BLT_k$, while p-channel MOS pass transistor 45b has its source/drain path connected between storage node SNB and bit line $BLB_k$. Word line $WL^*_j$ is connected to the gates of pass transistors 45a, 45b. Power switch transistor 44a within cell $50_{jk}$ is an n-channel MOS transistor with its drain at bias node $V_{ssi}$ (to which the source nodes of driver transistors 34a, 34b are connected) and its source at ground node $V_{ssa}$, and its gate receiving word line $WL^*_j$. In this case, word line $WL^*_j$ is driven active low in cycles in which row j is selected (and maintained inactive high in cycles in which row j is not selected).

Power switch transistor 44b is also an n-channel MOS transistor with its source at ground node $V_{ssa}$ and its drain at bias node $V_{ssi}$, in parallel with power switch transistor 44a. The gate of power switch transistor 38b receives column select line $CSL^*_k$, which is active low during write cycles in which column k is selected, and inactive high during cycles in which column k is not selected. As described above, for best performance, column select line $CSL^*_k$ can be gated by column select circuitry 32 to remain inactive high during read cycles in which column k is selected, although such gating is not essential.

The operation of memory cell $50_{jk}$ corresponds to that described above in connection with FIG. 6 for cell $40_{jk}$, except that the logic levels of the various signals are complementary. Bit lines $BLB_k$, $BLT_k$ are precharged low (i.e., at or near ground) at the beginning of each cycle, and one of which will be driven high by write circuitry in write operations to column k. In this embodiment of the invention, bias node $V_{ssi}$ is rendered floating in write cycles in which both row j is selected (word line $WL^*_j$ is inactive low) and also column k is selected (column select line $CSL^*_k$ is inactive low). This floating of bias node $V_{ssi}$ assists the change of stored state of cell $50_{jk}$ by one of bit lines $BLT_k$, $BLB_k$ that is driven a high level, because the counteracting drive of the one of drive transistors 34a, 34b that was previously on (i.e., holding its storage node SNT, SNB low) is reduced by the floating of bias node $V_{ssi}$.

Figure 8C:
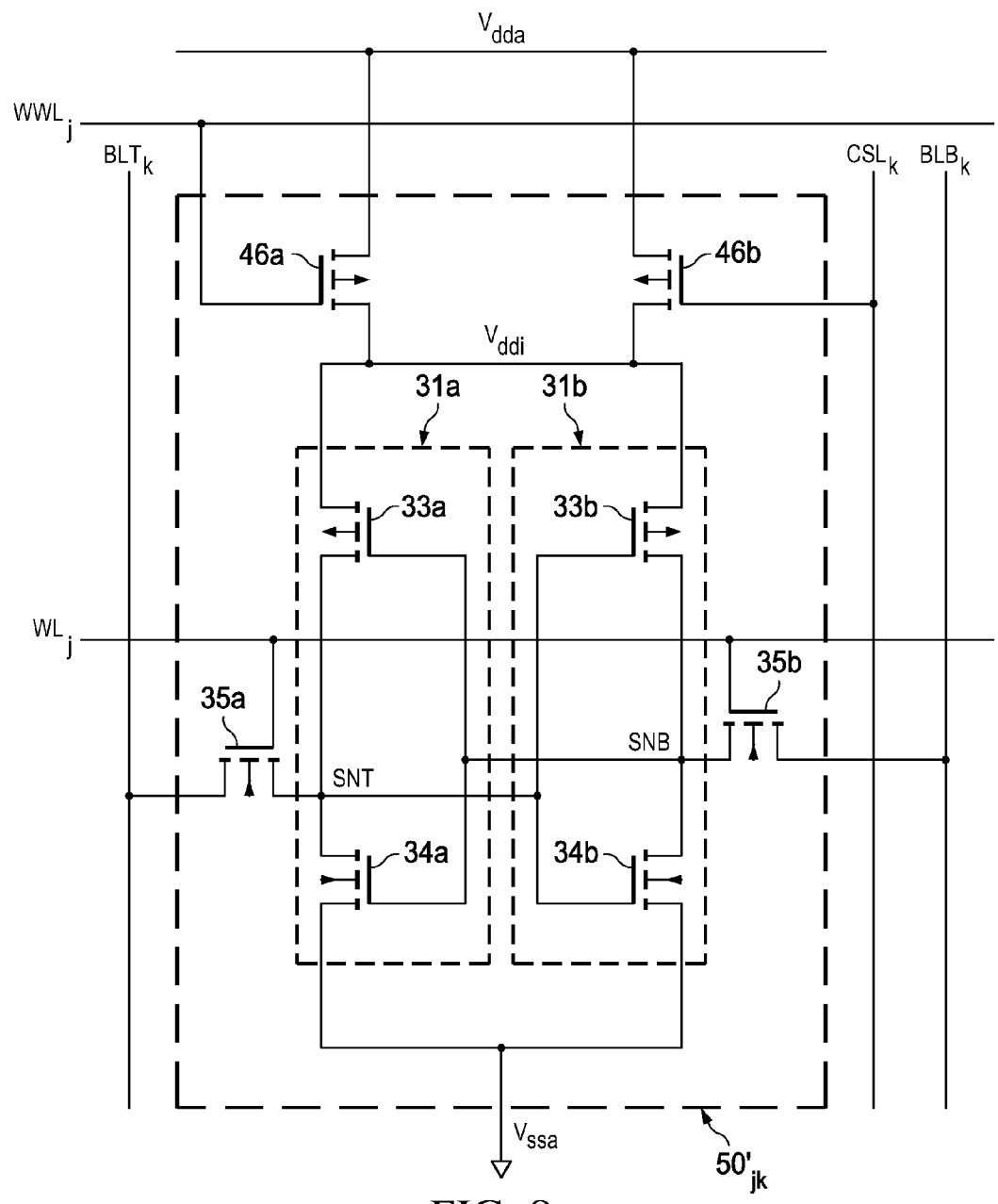

FIG. 8c illustrates memory cell $50'_{jk}$ according to a variation of the complementary construction of cell $50_{jk}$ of FIG. 8b. Memory cell $50'_{jk}$ includes cross-coupled inverters 31a, 31b constructed as n-channel load transistors 34a, 34b and p-channel drive transistors 33a, 33b, establishing storage nodes SNT, SNB as before. P-channel MOS pass transistors 35a, 35b couple respective storage nodes SNT, SNB to bit lines $BLT_k$, $BLB_k$, respectively, and are controlled by word line $WL^*_j$, which is active low upon selection of row j. In cell $50'_{jk}$ according to this implementation, the source nodes of load transistors 34a, 34b are connected directly to ground node $V_{ssa}$, while the source nodes of driver transistors 33a, 33b are connected together at bias node $V_{ddi}$. P-channel power switch transistors 46a, 46b have their drain nodes connected to bias node $V_{ddi}$, and their source nodes at power supply node $V_{dda}$. Similarly as cell $40'_{jk}$ of FIG. 8a, the gate of power switch transistor 46a receives write word line $WWL_j$, and the gate of power switch transistor 46b receives column select line $CSL_k$; each of write word line $WWL_j$ and $CSL_k$ are driven to an active high level upon row j being selected in a write cycle, and upon column k being selected by column select circuitry 32, respectively.

The operation of cell $50'_{jk}$ is similar to that of cell $40'_{jk}$ described above relative to FIG. 8a, but with complementary logic levels. To summarize, bit lines $BLT_k$, $BLB_k$ will be precharged low at the beginning of each cycle. In read and write cycles in which either row j or column k is not selected, one or both of power switch transistors 46a, 46b will remain on, such that full bias between power supply node $V_{dda}$ and ground node $V_{ssa}$ is applied to cross-coupled inverters 31a, 31b. In a read cycle in which row j is selected, write word line $WWL_j$ will remain at an inactive low level, such that power switch transistor 46a remains on; full bias across inverters 31a, 31b thus ensures good read current driven by cell $50'_{jk}$.

In a write cycle in which cell $50'_{jk}$ is selected (i.e., both row j and column k are selected), write word line $WWL_j$ and column select line $CSL_k$ are both driven high, which turns off both of power switch transistors 46a, 46b and isolates bias node $V_{ddi}$ from power supply node $V_{dda}$. The write level to be written is driven as a high level on the desired one of bit lines $BLT_k$, $BLB_k$, following the bit line precharge low. Energizing of word line $WL_j$ couples storage nodes SNT, SNB to bit lines $BLT_k$, $BLB_k$, respectively, allowing the write operation to take place. As described above, write assist is provided by the floating of bias node $V_{ddi}$, such that the one of driver transistors 33a, 33b that was previously turned on (defining the prior state) has greatly reduced drive. Its corresponding storage node SNT, SNB is more rapidly charged from bit line $BLT_k$, $BLB_k$, as the case may be, as a result.

Each of the embodiments of this invention described above provide the important advantages of floating the bias provided to the storage elements during write operations to the selected cell, while still maintaining full bias even in cells that are half-selected (i.e., cells that reside in the selected row but not a selected column, or in a selected column but not a selected row). As a result, write margin and performance is greatly improved by these embodiments of the invention, with little or no degradation of data retention or cell stability. And as described above relative to FIG. 7, this bit-by-bit write assist can be implemented in a relatively efficient manner in modern memory arrays, despite the addition of two transistors per cell.

According to alternative embodiments of the invention, the layout efficiency of bit-by-bit write assist can be made even more efficient, by including only a single power switch transistor. These alternative embodiments of the invention will now be described in connection with FIGS. 9a, 9b, 10a, and 10b.

Figure 9A:
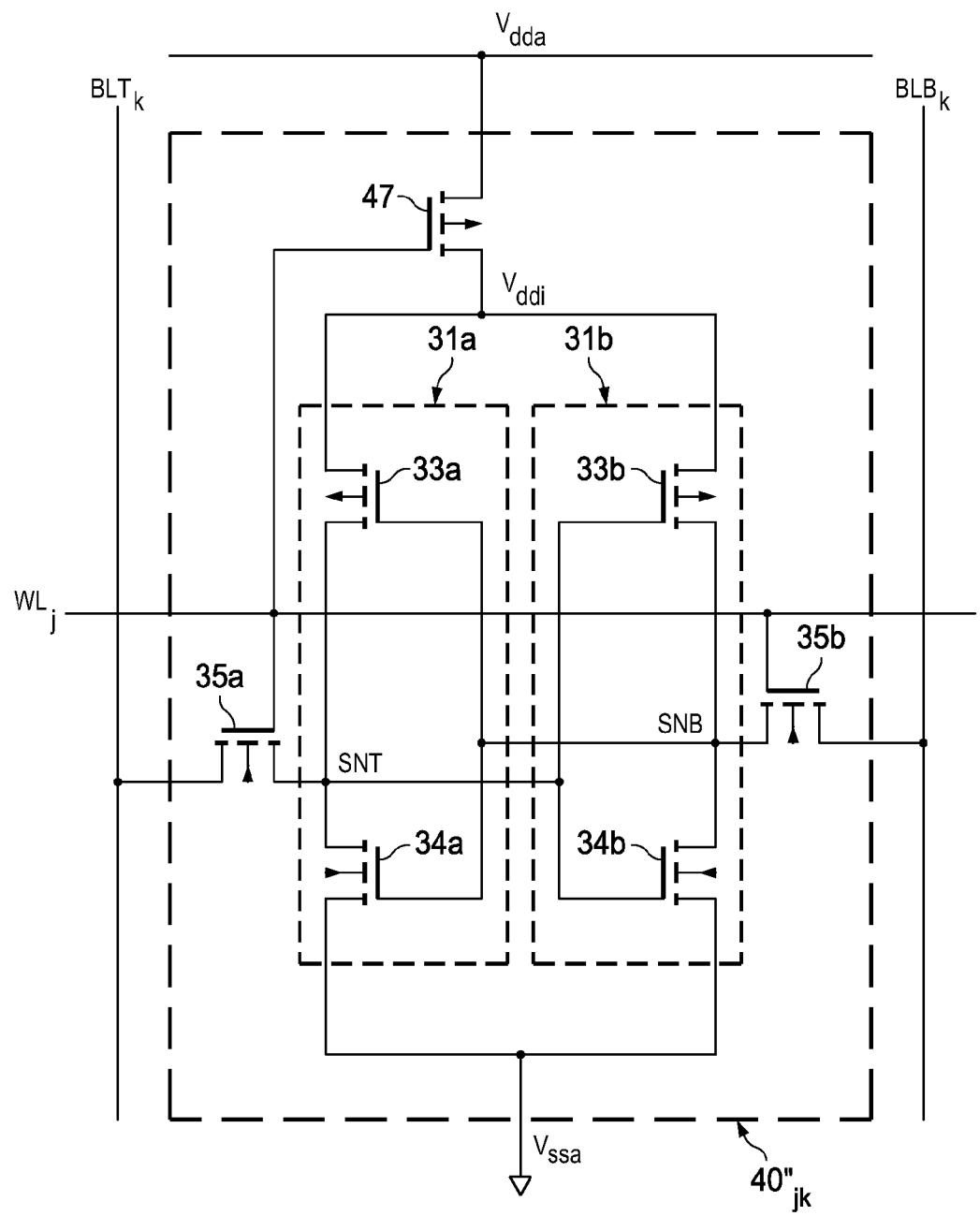
FIG. 9a is an electrical diagram, in schematic form, of a memory cell in the memory of FIG. 3 according to another embodiment of the invention.

Referring first to FIG. 9a, cell $40''_{jk}$ according to one alternative embodiment of the invention will be described. Cell $40''_{jk}$ is a variation of memory cell $40_{jk}$ of FIG. 4, for which like elements will be referred to by the same reference numerals. Cell $40''_{jk}$ includes transistors 33, 34, 35 as described above in connection with cell $40_{jk}$, but includes only a single power switch transistor 47 connected between the source nodes of load transistors 33a, 33b at bias node $V_{ddi}$, and power supply node $V_{dda}$. Power switch transistor 47 is a p-channel MOS transistor, with a gate connected to word line $WL_j$.

Figure 9B:
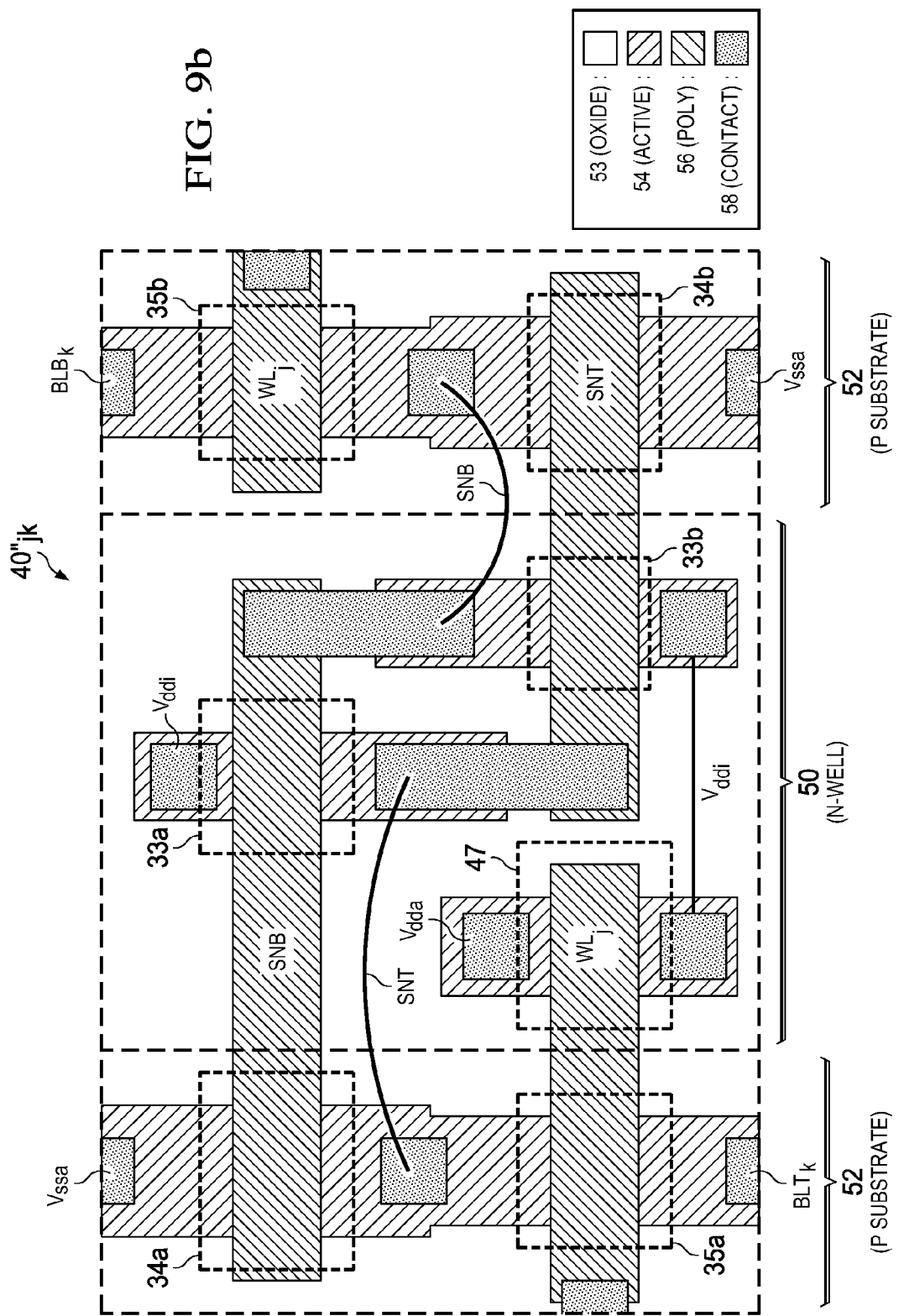
FIG. 9b is a plan view of the surface of an integrated circuit illustrating an example of the layout of the memory cell of FIG. 9a according to that embodiment of the invention.

FIG. 9b illustrates the extent to which chip area can be saved by the single power transistor 47 within an instance of memory cell $40''_{jk}$. In comparison with FIG. 7, the layout of FIG. 9b differs by the removal of transistor 36b; power switch transistor 47 of FIG. 9b is constructed identically with power switch transistor 36a of FIG. 7, within n-well 52, as evident in the drawings. Bias node $V_{ddi}$ is connected by way of a metal conductor (not shown) between contact opening 58 to transistor 33a and contact openings 58 to transistors 33b, 47, indicated by the schematic line labeled $V_{ddi}$. The use of only a single power switch transistor 47 substantially reduces the chip area required for the realization of memory cell $40''_{jk}$, as compared with memory cell $40_{jk}$ of FIG. 7.

The operation of cell $40''_{jk}$, when written to, follows that described above relative to FIG. 6. To summarize, upon word line $WL_j$ being energized as row j is selected, power switch transistor 47 is turned off, isolating bias node $V_{ddi}$ from power supply node $V_{dda}$, reducing the drive through the one of load transistors 33a, 33b that was previously turned on, and thus assisting the change of stored state. According to this embodiment of the invention, however, this floating of bias node $V_{ddi}$ occurs by power switch transistor 47 being turned off, in read or write cycles in which row j is selected even if column k is not selected. It is contemplated that, in many situations, the charge stored at bias node $V_{ddi}$ prior to the energizing of word line $WL_j$ provides sufficient bias, throughout the cycle, so that upon word line $WL_j$ returning to a low level, the latching effect of cell $40''_{jk}$ will return the previously stored state.

Figure 10A:
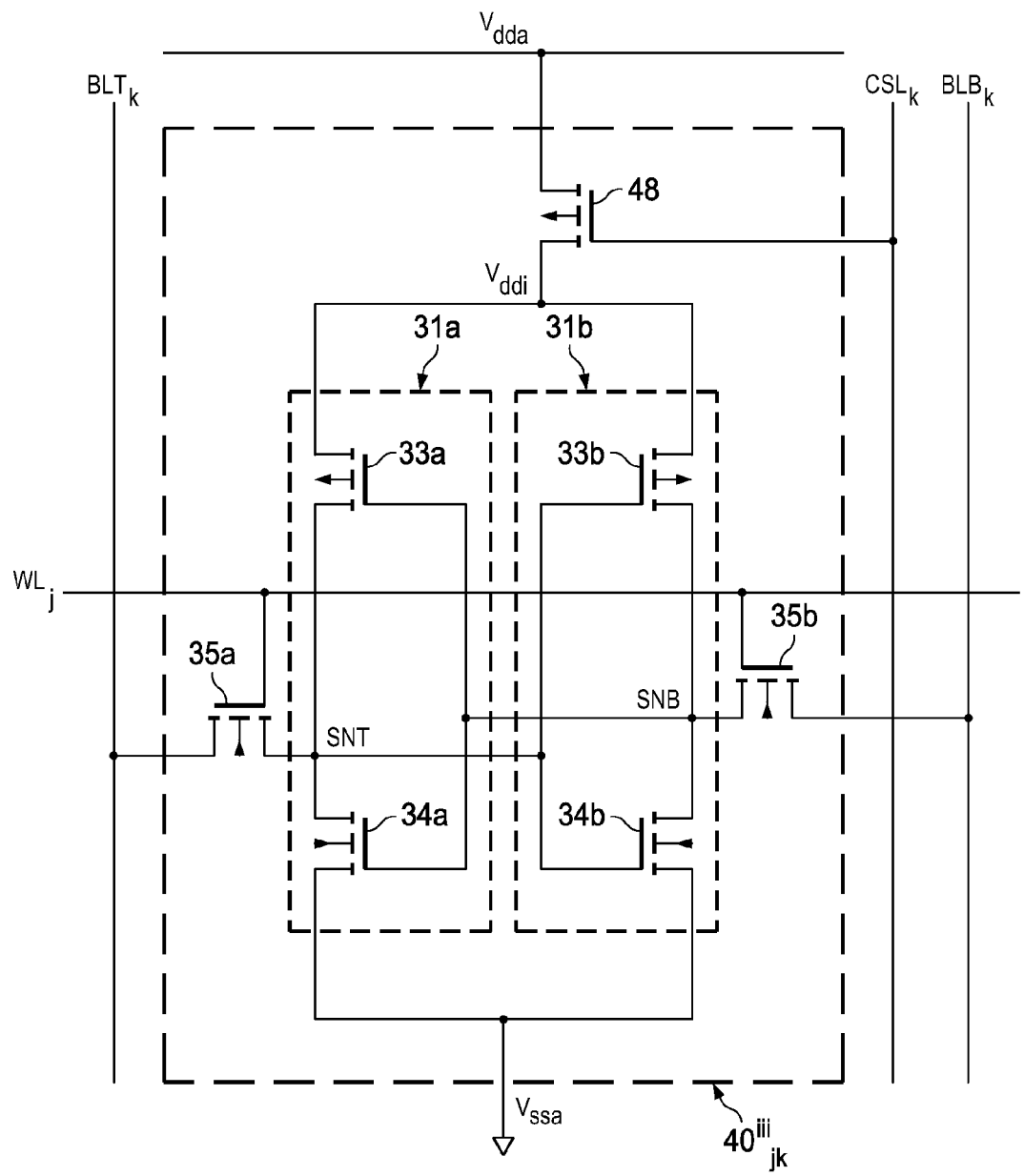
FIG. 10a is an electrical diagram, in schematic form, of a memory cell in the memory of FIG. 3 according to another embodiment of the invention.
Figure 10B:
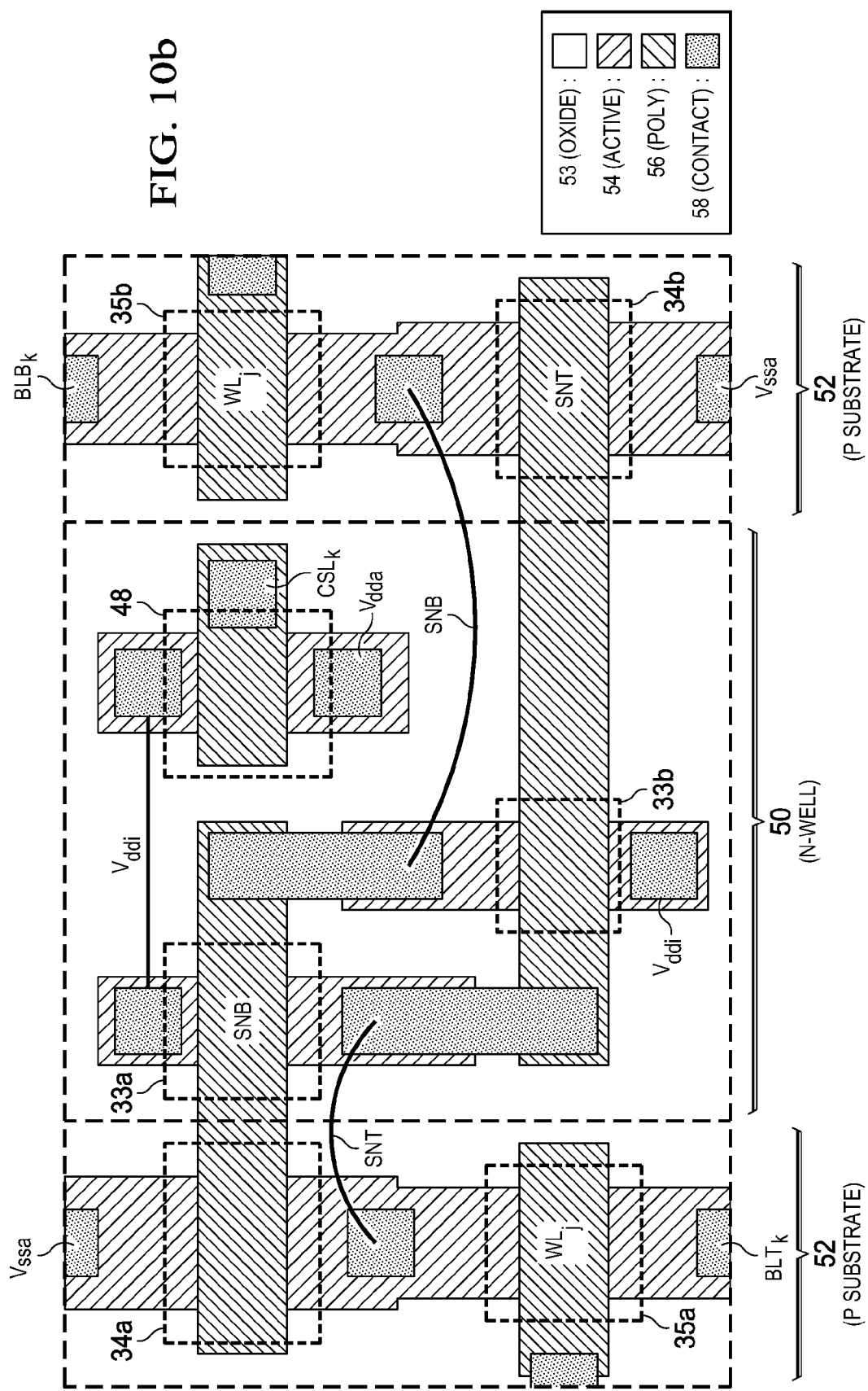
FIG. 10b is a plan view of the surface of an integrated circuit illustrating an example of the layout of the memory cell of FIG. 10a according to that embodiment of the invention.

FIGS. 10a and 10b illustrate another alternative embodiment of the invention, by way of memory cell $40'''_{jk}$, in which single power switch transistor 48 is provided between bias node $V_{ddi}$ at the source nodes of load transistors 33a, 33b, and power supply node $V_{dda}$. In this example, as before, power switch transistor 48 is a p-channel MOS transistor with its source/drain path connected between bias node $V_{ddi}$ and power supply node $V_{dda}$. The gate of power switch transistor 48 receives column select line $CSL_k$, which as described above is energized in write cycles in which column k containing memory cell $40'''_{jk}$.

FIG. 10b illustrates the extent to which chip area can be saved by the single power transistor 47 within an instance of memory cell $40^{iii}_{jk}$. In comparison with FIG. 7, the layout of FIG. 10b differs by the removal of transistor 36a. Single power switch transistor 48 in the layout of FIG. 10b is constructed identically with power switch transistor 36b of FIG. 7, in the same location within n-well 52 as shown by the drawings. Bias node $V_{ddi}$ is connected by way of a metal conductor (not shown) between contact opening 58 to transistor 33b and contact openings 58 to transistors 33a, 48, indicated by the schematic line labeled $V_{ddi}$. The use of only a single power switch transistor 48 also substantially reduces the chip area required for the realization of memory cell $40^{iii}_{jk}$, as compared with memory cell $40_{jk}$ of FIG. 7.

The operation of cell $40^{iii}_{jk}$ during a write operation essentially follows that described above in connection with FIG. 6. Write assist is provided by power switch transistor 48 being turned off during a write cycle in which column k contains the cell 40 being written to. The floating of bias node $V_{ddi}$ assists the write of cell $40^{iii}_{jk}$, when selected, by reducing the drive of the one of load transistors 33a, 33b that was previously on and holding its storage node SNT, SNB, respectively, at a high level. The one of bit lines $BLT_k$, $BLB_k$ receiving the low input data level can thus more easily overcome the previous stored state.

According to this embodiment of the invention, however, bias node $V_{ddi}$ floats as a result of power switch transistor 48 turned off in read or write cycles in which column k is selected even if row j is not selected. It is contemplated that, in many situations, the charge stored at bias node $V_{ddi}$ will provide adequate sufficient bias for data retention even during such half-selection, especially considering that word line $WL_j$ remains inactive low.

As described above in connection with FIGS. 8a through 8c, variations in the channel conductivity type, placement of the power switch transistors as footer devices rather than header devices, and the like, can be applied to cell $40''_{jk}$ and $40^{iii}_{jk}$, without departing from the scope of the invention. In each case, it is contemplated that those skilled in the art having reference to this specification can evaluate the tradeoff between the chip area saved by way of this single power transistor construction, relative to the resulting degradation, if any, in data retention or cell stability.

According to embodiments of this invention, therefore, write assist is applied on a bit-by-bit basis, rather than on a column-by-column or block-by-block basis of conventional static memories. It is contemplated that the write margin will be enhanced by this construction and operation, with minimal adverse effects from the standpoint of data retention or cell stability, even for half-selected cells within the array. As a result, the write assist bias is applied without requiring precise control of a reduced write assist to an entire column, which necessarily requires contemplation of the minimum data retention voltage for the weakest, or most unstable, cell in that column.

Furthermore, it is contemplated that the write operation can be performed more quickly according to embodiments of this invention. This faster write results from the greatly reduced capacitance of the floating bias node in embodiments of the invention; that floating node resides within the selected cell, rather than at a conductor that extends the length of the column in the array, as in conventional by-column write assist schemes. The drive of the previously turned on transistor in the cell is thus more easily overcome according to embodiments of this invention.

As a result of embodiments of this invention, therefore, it is contemplated that the write margin of memory cells in the array can be widened from that previously available, without adversely impacting the cell stability margin, which widens the overall design window for the memory cells. This wider design window is made available even for modern sub-micron device sizes, including those in which the drive of p-channel load transistors approaches that of the corresponding n-channel driver transistors, as is more often encountered in modern minimum feature size technologies. All of these advantages are available, according to embodiments of this invention, by way of efficiently implemented layouts, and thus minimum chip area impact.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An array of solid-state memory cells, each memory cell comprising:
    a storage element;
    a first pass transistor having a conduction path connected between the storage element and a first bit line, and having a control terminal coupled to a word line; and
    a first switch transistor included within the memory cell, having a conduction path connected in series with the storage element between first and second bias nodes, and having a control terminal coupled to receive a cell select signal so that the first switch transistor is turned off responsive to the cell select signal selecting that cell.

2. The array of claim 1, wherein each memory cell further comprises:
    a second pass transistor having a conduction path connected between the storage element and a second bit line, and having a control terminal coupled to the word line.

3. The array of claim 2, wherein the storage element of each memory cell comprises:
    first and second inverters, each inverter connected in series with the first switch transistor between the first and second bias nodes.

4. The array of claim 3, wherein each of the first and second inverters comprises a CMOS inverter.

5. The array of claim 1, wherein the first bias node receives a power supply voltage;
    wherein the second bias node receives a reference voltage;
    and wherein the conduction path of the first switch transistor is connected between the first bias node and the storage element.

6. The array of claim 5, wherein the memory cells are arranged in rows and columns in the array;
    wherein the cell select signal received at the control terminal of the first switch transistor for a memory cell corresponds to a word line that is energized to select memory cells in the row containing that memory cell.

7. The array of claim 6, wherein the cell select signal received at the control terminal of the first switch transistor for a memory cell corresponds to a write word line corresponding to the row including the memory cell.

8. The array of claim 5, wherein the memory cells are arranged in rows and columns in the array;
    wherein the cell select signal received at the control terminal of the first switch transistor for a memory cell corresponds to a column select signal that is energized during a write operation to a memory cell in the column containing that memory cell.

9. The array of claim 8, wherein each memory cell further comprises:
a second switch transistor, having a conduction path connected between the first bias node and the storage element, and having a control terminal coupled to a word line that is energized to select memory cells in the row containing that memory cell, so that the second switch transistor is turned off responsive to the word line being energized.

10. The array of claim 1, wherein the first bias node receives a power supply voltage;
wherein the second bias node receives a reference voltage; and wherein the conduction path of the first switch transistor is connected between the storage element and the second bias node.

11. The array of claim 10, wherein the memory cells are arranged in rows and columns in the array;
wherein the cell select signal received at the control terminal of the first switch transistor for a memory cell corresponds to a word line that is energized to select memory cells in the row containing that memory cell.

12. The array of claim 10, wherein the memory cells are arranged in rows and columns in the array;
wherein the cell select signal received at the control terminal of the first switch transistor for a memory cell corresponds to a column select signal that is energized during a write operation to a memory cell in the column containing that memory cell.

13. The array of claim 12, wherein each memory cell further comprises:
a second switch transistor, having a conduction path connected between the first bias node and the storage element, and having a control terminal coupled to a word line that is energized to select memory cells in the row containing that memory cell, so that the second switch transistor is turned off responsive to the word line being energized.

14. A method of operating a solid-state memory, the memory comprising a plurality of memory cells arranged in rows and columns, each row of memory cells associated with a word line, each column of memory cells associated with a bit line; wherein each memory cell comprises a storage element, a first pass transistor coupled between the storage element and an associated bit line and controlled by an associated word line, and a first switch transistor connected in series with the storage element between first and second bias nodes; the method comprising:
turning on the first switch transistor in each of the plurality of memory cells;
then, in a write cycle, driving the bit line associated with a selected column to a desired write data level;
in the write cycle, turning off the first switch transistor of the memory cell in a selected row and the selected column; and
in the write cycle, energizing the word line associated with the selected row.

15. The method of claim 14, further comprising:
before the write cycle, precharging the bit line to a precharge voltage; and
wherein the step of driving the bit line comprises driving the bit line to a voltage different from the precharge voltage, and corresponding to a data state to be written into the memory cell in the selected row and the selected column.

16. The method of claim 14, wherein the first switch transistor has a control terminal coupled to the word line, so that the step of turning off the first switch transistor occurs responsive to the energizing step.

17. The method of claim 14, further comprising:
in the write cycle, energizing a column select line associated with the selected column;
wherein the first switch transistor has a control terminal coupled to the column select line, so that the step of turning off the first switch transistor occurs responsive to the step of energizing the column select line.

18. The method of claim 17, wherein each memory cell further comprises a second switch transistor connected in series with the storage element between the first and second bias nodes, the second switch transistor having a control terminal coupled to the word line.

19. The method of claim 14, further comprising:
in a read cycle after the step of turning on the first switch transistor, keeping turned on the first switch transistor of the memory cell in the selected row and the selected column.

20. An integrated circuit, comprising a solid state memory, the memory comprising:
address decoder circuitry, for receiving an address value and for generating cell select signals responsive to the address value;
an array of solid-state memory cells arranged in rows and columns, each memory cell comprising:
a storage element;
a first pass transistor for selectively coupling the storage element to a first bit line associated with its column of memory cells, responsive to a word line associated with its row of memory cells; and
a first switch connected in series with the storage element between first and second bias nodes, and responsive to a cell select signal corresponding to the cell so that the first switch is opened responsive to that cell being selected; and
read/write circuitry coupled to the bit lines of the columns of memory cells.

21. The integrated circuit of claim 20, wherein first and second bit lines are associated with each column of memory cells; and wherein the storage element of each memory cell comprises:
first and second inverters, each inverter connected in series with the first switch between the first and second bias nodes.

22. The integrated circuit of claim 20, wherein the first bias node receives a power supply voltage;
wherein the second bias node receives a reference voltage; and wherein the first switch has a conduction path connected between the first bias node and the storage element.

23. The integrated circuit of claim 20, wherein the first bias node receives a power supply voltage;
wherein the second bias node receives a reference voltage; and wherein the first switch has a conduction path connected between the storage element and the second bias node.

24. The integrated circuit of claim 20, wherein the address decoder circuitry comprises:
a row decoder for decoding a row portion of the address value, and for driving one of a plurality of word lines responsive to the value of the row portion of the address signal;

wherein the cell select signal to which the first switch in a memory cell is responsive corresponds to the word line for the row associated with that cell.

25. The integrated circuit of claim 24, wherein the cell select signal corresponds to a write word line for the row associated with that cell.

26. The integrated circuit of claim 20, wherein the address decoder circuitry further comprises:
- a column decoder for decoding a column portion of the address value, and for driving one of a plurality of column select lines during a write operation, responsive to the value of the column portion of the address signal;
- wherein the cell select signal to which the first switch in a memory cell is responsive corresponds to the column select line for the column associated with that cell.

27. The integrated circuit of claim 26, wherein the address decoder circuitry further comprises:
- a row decoder for decoding a row portion of the address value, and for driving one of a plurality of word lines responsive to the value of the row portion of the address signal; wherein each memory cell further comprises:
- a second switch, connected in parallel with the first switch, and responsive to a word line so that the second switch is opened responsive to the row associated with that memory cell being selected.

* * * * *